(12) United States Patent
Loscutoff et al.

(10) Patent No.: US 9,893,224 B2
(45) Date of Patent: Feb. 13, 2018

(54) EMITTERS OF A BACKSIDE CONTACT SOLAR CELL

(71) Applicant: SUNPOWER CORPORATION, San Jose, CA (US)

(72) Inventors: Paul Loscutoff, Castro Valley, CA (US); Gabriel Harley, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/365,742

(22) Filed: Nov. 30, 2016

(65) Prior Publication Data

US 2017/0084770 A1    Mar. 23, 2017

Related U.S. Application Data

(62) Division of application No. 14/318,374, filed on Jun. 27, 2014, now Pat. No. 9,537,041.

(51) Int. Cl.
| | | |
|---|---|---|
| *H01L 31/065* | (2012.01) | |
| *H01L 31/18* | (2006.01) | |
| *H01L 31/0216* | (2014.01) | |
| *H01L 31/0224* | (2006.01) | |
| *H01L 21/268* | (2006.01) | |
| *H01L 21/228* | (2006.01) | |

(Continued)

(52) U.S. Cl.
CPC .......... *H01L 31/065* (2013.01); *H01L 21/228* (2013.01); *H01L 21/2225* (2013.01); *H01L 21/268* (2013.01); *H01L 31/02008* (2013.01); *H01L 31/02167* (2013.01); *H01L 31/022425* (2013.01); *H01L 31/022441* (2013.01); *H01L 31/0516* (2013.01); *H01L 31/0682* (2013.01); *H01L 31/1804* (2013.01); *H01L 31/1864* (2013.01); *Y02E 10/50* (2013.01); *Y02E 10/547* (2013.01); *Y02P 70/521* (2015.11)

(58) Field of Classification Search
CPC .............. H01L 21/2225; H01L 21/268; H01L 31/02008; H01L 31/02167; H01L 31/022425; H01L 31/022441; H01L 31/0516; H01L 31/0682; H01L 21/228; Y02E 10/50
See application file for complete search history.

(56) References Cited

U.S. PATENT DOCUMENTS

| 8,399,331 B2 | 3/2013 | Moslehi et al. |
| 9,171,723 B2 | 10/2015 | Hallam et al. |

(Continued)

OTHER PUBLICATIONS

FAI Pre-Interview Communication from U.S. Appl. No. 14/318,374 dated May 18, 2016, 4 pgs.

*Primary Examiner* — Bac Au
(74) *Attorney, Agent, or Firm* — Schwabe, Williamson & Wyatt, P.C.

(57) ABSTRACT

A system and method of patterning dopants of opposite polarity to form a solar cell is described. Two dopant films are deposited on a substrate. A laser is used to pattern the N-type dopant, by mixing the two dopant films into a single film with an exposure to the laser and/or drive the N-type dopant into the substrate to form an N-type emitter. A thermal process drives the P-type dopant from the P-type dopant film to form P-type emitters and further drives the N-type dopant from the single film to either form or further drive the N-type emitter.

20 Claims, 8 Drawing Sheets

(51) Int. Cl.
*H01L 31/02* (2006.01)
*H01L 21/22* (2006.01)
*H01L 31/05* (2014.01)
*H01L 31/068* (2012.01)

(56) References Cited

U.S. PATENT DOCUMENTS

| | | |
|---|---|---|
| 2012/0122272 A1 | 5/2012 | Rana et al. |
| 2013/0344637 A1* | 12/2013 | Kim ................. H01L 31/18 |
| | | 438/57 |
| 2014/0158193 A1 | 6/2014 | Desphande et al. |
| 2015/0017747 A1* | 1/2015 | Lam ............... H01L 31/022425 |
| | | 438/14 |

\* cited by examiner

EMITTERS OF A BACKSIDE CONTACT SOLAR CELL

CROSS-REFERENCE TO RELATED APPLICATIONS

This application is a divisional of U.S. patent application Ser. No. 14/318,374, filed on Jun. 27, 2014, the entire contents of which are hereby incorporated by reference herein.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a PN junction between P-type and N-type diffusion regions. Solar radiation impinging on the surface of, and entering into, the substrate of the solar cell creates electron and hole pairs in the bulk of the substrate. The electron and hole pairs migrate to P-type diffusion and N-type diffusion regions in the substrate, thereby creating a voltage differential between the diffusion regions. The diffusion regions are connected to conductive regions on the solar cell to direct an electrical current from the solar cell to an external circuit. In a backside contact solar cell, for example, both the diffusion regions and the interdigitated metal contact fingers coupled to them are on the backside of the solar cell. The contact fingers allow an external electrical circuit to be coupled to and be powered by the solar cell.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
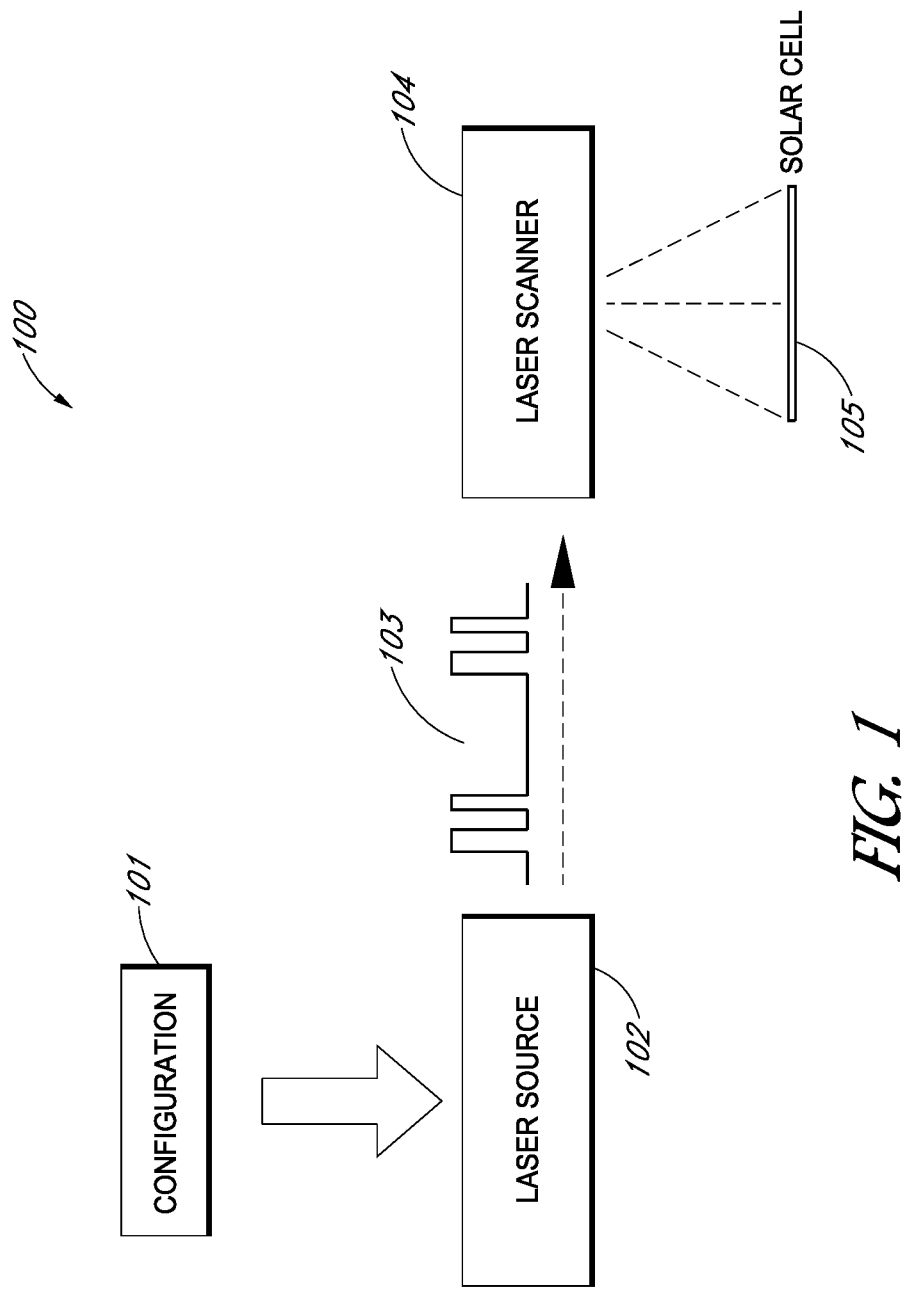
FIG. 1 schematically illustrates a solar cell laser system in accordance with an embodiment.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" dopant source does not necessarily imply that this dopant source is the first dopant source in a sequence; instead the term "first" is used to differentiate this dopant source from another dopant source (e.g., a "second" dopant source).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of solar cells for ease of understanding, the disclosed techniques and structures apply equally to other semiconductor structures (e.g., silicon wafers generally).

In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography techniques, are not described in detail in order to not unnecessarily obscure embodiments of the present disclosure. Furthermore, it is to be understood that the various embodiments shown in the figures are illustrative representations and are not necessarily drawn to scale.

Interdigitated back contact (IBC) solar cells require that both P and N types of emitters are formed on the backside of the wafer, in a specific pattern. This patterning and formation of the two emitters results in much of the cost for forming the IBC cell. Reduction of emitter formation cost is desirable to make an IBC cell process more cost effective.

Accordingly, a method is described for patterning the dopants to form an interdigitated back contact (IBC) solar cell. IBC solar cells eliminate contact-related shading losses by putting both contacts on the rear of the cell. In one embodiment, the method includes blanket deposition of two dopant films, a Boron Silicate Glass (BSG) film followed by a Phosphorous Silicate Glass (PSG) film. A laser may be applied or directed such as impinged to pattern an N-type dopant, by mixing the PSG and BSG films where they are exposed to the laser to form a boro phospho silicate glass (BPSG) film and/or drive Phosphorous into a solar cell substrate to form an N-type emitter. After the laser patterning and laser diffusion, the solar cell is subjected to a thermal anneal, which serves to drive the Boron dopant from the non-lased BSG regions to form P-type emitters and drive Phosphorous dopant from the lased BPSG regions to either form or further drive the N-type emitter. This thermal anneal can also serve to repair any damage to the substrate from the laser patterning or blanket deposition step. The method relies on laser patterning design rules, which are tighter and more precise than other patterning methods, particularly screen-printing. Because the dopant films are deposited as a blanket film stack without any patterning step in-between, they can be deposited in a single tool. This process can remove the need for a mask and an etch process, removing a wet tool for oxide etch from the fabrication line.

This specification first describes a laser system used to form an example solar cell, followed by a more detailed explanation of various embodiments of forming emitters of solar cells with a laser process. Various examples are provided throughout.

FIG. 1 schematically illustrates a solar cell laser system 100 in accordance with an embodiment. In the example of FIG. 1, the laser system 100 includes a laser source 102 and a laser scanner 104. Although illustrated for descriptive purposes, the drawings are not to scale and some items may be omitted for clarity. The arrangement shown is representative of the components and may or may not reflect their true positioning relative to one another in some embodiments. The laser scanner 104 may comprise a galvanometer laser scanner.

In operation, the laser source 102 generates laser pulses 103 at a predetermined wavelength, in accordance with a configuration 101. The configuration 101 may comprise switch/knob arrangements, computer-readable program code, software interface settings, and/or other ways of setting the configurable parameters of the laser source 102. The configuration 101 may set the pulse repetition rate, number of pulses fired per repetition, pulse shape, pulse amplitude, pulse intensity or energy, and other parameters of the laser source 102. The laser scanner 104 scans the laser pulses 103 across a solar cell 105 being fabricated.

Generally, a film stack consisting of a BSG and a PSG layer as two dopant films is formed above a wafer, with the BSG film as the film in contact with an underlying silicon substrate. The substrate could be either a crystalline silicon or a polysilicon substrate. By using the laser system 100, a laser is used to pattern the substrate, lasing the areas which will comprise an N-type emitter. Upon lasing, the film stack undergoes a mixing where a BPSG film is generated from the composite of the BSG and PSG films. During the lasing, an amount of the Phosphorous and/or Boron dopants may be diffused into the silicon substrate. Phosphorous preferentially dopes over Boron out of the BPSG film, and the N-type emitter can be created from the diffusion. After lasing the pattern into the film stack, the wafer can be subjected to a thermal anneal, which functions to drive Boron from the BSG film into the substrate to form the P-type emitter. During this thermal anneal, Phosphorous is also driven from the BPSG film to form or further drive the diffusion for the N-type emitter. The anneal process can also serve to repair any damage to the silicon substrate caused by the laser patterning step. Thus by this process both emitters for an IBC solar cell are created.

Figure 2:
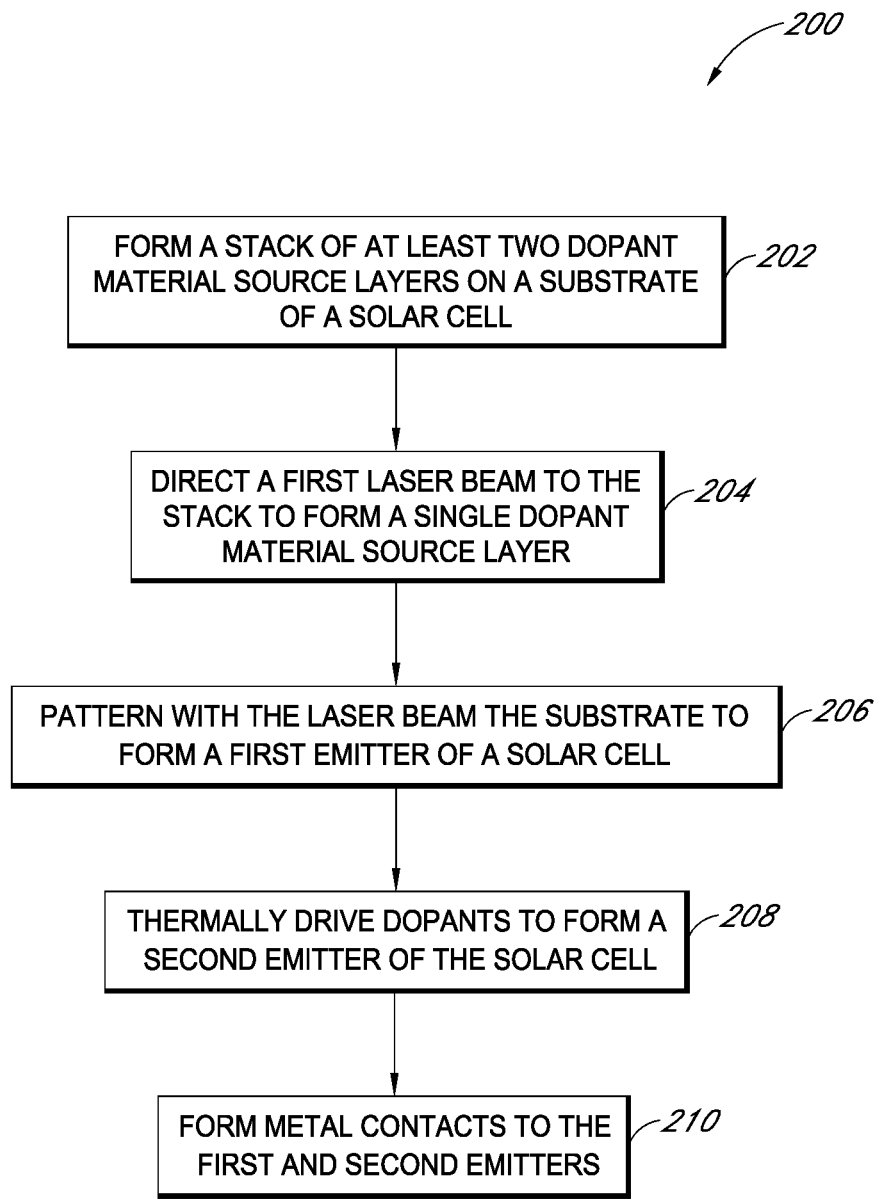
FIG. 2 is a flow chart of an embodiment of a method, technique, and process for forming emitters of a backside contact solar cell with a combination of a laser doping and a thermal doping, according to one embodiment.

Referring to FIG. 2, a flowchart 200 is shown that represents operations in a method of forming P-type and N-type emitters for a backside contact solar cell 360 (FIG. 3F) such as an IBC solar cell, in accordance with an embodiment. FIGS. 3A-3F illustrate cross-sectional views of various stages in the fabrication of the backside contact solar cell 360, corresponding to operations of flowchart 200, in accordance with an embodiment of the present invention. In this example, the mentioned process steps are performed in the order shown. In other examples, the process steps can be performed in other orders. It is to be noted that other process steps not necessary for understanding are omitted in the interest of clarity.

In addition, in some embodiments, the process can include fewer than all the illustrated steps in FIG. 2. The various process steps performed in connection with the method shown in the flowchart 200 may be performed by software, hardware, firmware, or any combination thereof. For illustrative purposes, the following description of the method shown in the flowchart 200 may refer to elements mentioned above in connection with FIGS. 3A-3F. In practice, portions of the method shown in the flowchart 200 may be performed by different elements of the described system, e.g., the solar cell laser system 100. It should be appreciated that the method shown in the flowchart 200 may include any number of additional or alternative process steps, the method shown in the flowchart 200 may be incorporated into a more comprehensive procedure or process having additional functionality not described in detail herein.

Figure 3A:
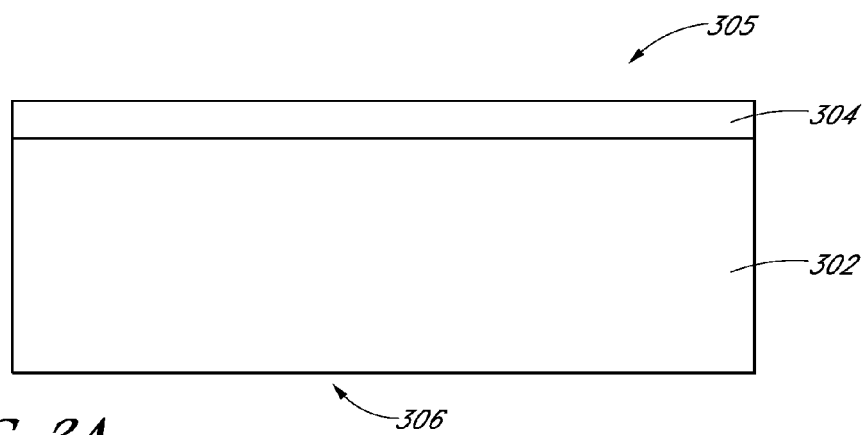
FIGS. 3A-3F illustrate cross-sectional views of forming emitters of a backside contact solar cell, according to some embodiments.
Figure 3B:
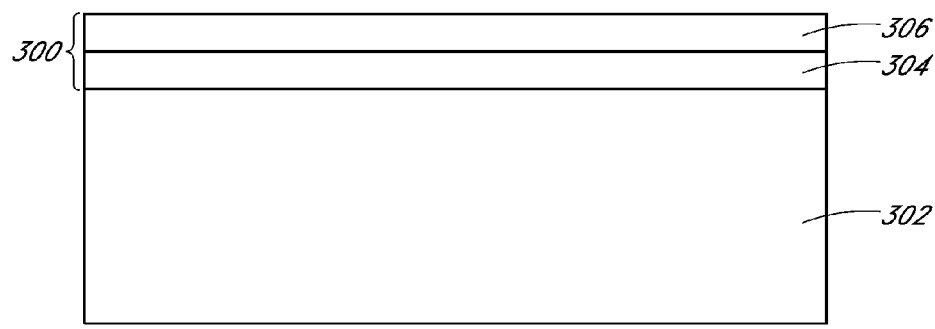

Referring to operation 202 of the flowchart 200, and to corresponding FIGS. 3A-3B, a method of forming emitters for the backside contact solar cell 360 includes forming a homogenous stack 300 (FIG. 3B) of at least two dopant material source layers above a solar cell substrate 302 (see FIG. 3A) of the solar cell 360. In an embodiment, the substrate 302 is a bulk single-crystal substrate, such as an N-type doped single crystalline silicon substrate or N-type silicon wafer. However, in an alternative embodiment, the substrate 302 may include a polycrystalline silicon layer disposed on a global solar cell substrate.

As illustrated, FIG. 3A shows a first dopant material source layer 304 of the stack 300 and it has dopants of a first impurity conductivity type such as P-type, e.g., Boron. For example, a P-type dopant source of Boron with a dopant concentration level of approximately in a range of 1-5% wt as the BSG film may be used to form a P-type emitter in the Si with 1E18 atom/cm-1E21 atom/cm3 concentration.

FIG. 3B shows a second dopant material source layer 306 over the first dopant material source layer 304 and it has dopants of a second impurity conductivity type being of opposite polarity from dopants of the first impurity conductivity type such as N-type, e.g., Phosphorous. For example, an N-type dopant source that comprises Phosphorus with a dopant concentration level of approximately in a range of up to 10% wt as the PSG film may be used to form an N-type emitter in the Si with 1E18 atoms/cm3-1E21 atoms/cm3 concentration. Although N-type dopants as Phosphorous and P-Type dopants as Boron are described, other donor and accepter dopants can be used in other embodiments.

As shown, the stack 300 is deposited on a backside surface of the substrate 302. As illustrated, FIG. 3A shows the solar cell substrate 302 having a backside 305 and a front side 306. There are a plurality of P-type diffusion regions and N-type diffusion regions in a solar cell but only one of each is shown as being fabricated in the following example for clarity of illustration.

In certain embodiments, including the illustrated embodiment, the stack 300 includes two dopant material source layers, the first dopant material source layer 304 and the second dopant material source layer 306. In other embodiments, however, more layers including dopant material source layers can be included in the stack 300. Thus, other embodiments of the stack 300 can be used in the techniques described herein.

In an embodiment, forming the stack 300 of at least two dopant material source layers includes depositing a first dopant source film of a first impurity conductivity type above the substrate 302 of the solar cell and depositing a second dopant source film of a second impurity conductivity type above the first dopant source film. The first and second dopant source films may be formed by Chemical Vapor Deposition (CVD). In an embodiment, the first dopant material source layer 304 is composed of boron silicate glass (BSG) and has a thickness approximately in the range of 400-500 Angstroms (e.g., films down to ~200 Angstroms). In one embodiment, the total deposited thickness, including an un-doped capping layer may be in a range of 1000-3000 Angstroms.

In a specific embodiment, the BSG layer is formed by chemical vapor deposition as a uniform, blanket layer. In a particular such embodiment, the BSG layer is formed by a chemical vapor deposition technique such as, but not limited to, atmospheric pressure chemical vapor deposition (AP-CVD), plasma-enhanced chemical vapor deposition (PECVD), low-pressure chemical vapor deposition (LP-CVD), or ultra-high vacuum chemical vapor deposition (UHVCVD). The concentration of Boron (B) in the BSG layer is at levels in a range of ~4% to ~1-2%. It should be noted that the discussion of the formation of the BSG layer is not intended to be limiting as to the scope of the invention described herein since a doping layer, e.g., the first dopant material source layer 304 could also be formed using other materials (e.g., spin-on or printed dopants) that also provide an amount of a dopant material to the surface of the substrate 302 during one or more laser and/or thermal processing steps without deviating from the basic scope of the embodiment described herein.

In one embodiment, the second dopant material source layer 306 comprises phosphorus silicate glass (PSG) grown on the surface of the boron silicate glass (BSG) and has a thickness approximately in the range of 400-500 Angstroms (e.g., films down to ~200 Angstroms). In a specific embodiment, the PSG layer is formed by chemical vapor deposition as a uniform, blanket layer. In a particular such embodiment, the PSG layer is formed by a chemical vapor deposition technique such as, but not limited to, atmospheric pressure chemical vapor deposition (APCVD), plasma-enhanced chemical vapor deposition (PECVD), low-pressure chemical vapor deposition (LPCVD), or ultra-high vacuum chemical vapor deposition (UHVCVD). The concentration of Boron (B) in the PSG oxide layer is at levels in a range of ~4% to ~1-2%. It should be noted that the discussion of the formation of the PSG layer is not intended to be limiting as to the scope of the invention described herein since a doping layer, e.g., the second dopant material source layer 306 could also be formed using other materials that also provide an amount of a dopant material to the surface of the substrate 302 during one or more laser and/or thermal processing steps without deviating from the basic scope of the invention described herein.

Figure 3C:
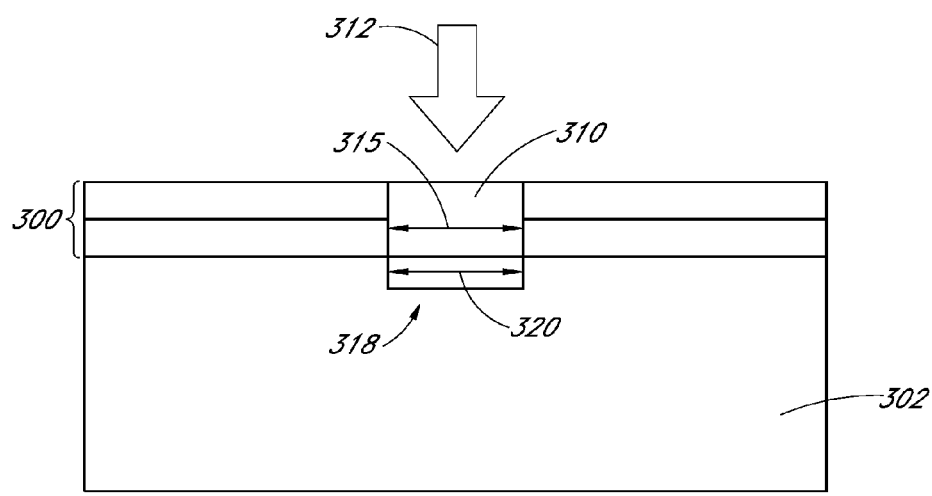

Referring to operation 204 of the flowchart 200, and to corresponding FIG. 3C, forming of a heterogeneous single dopant material source layer 310 such as a charge-neutral layer containing both P-type dopants and N-type dopants sourced from both the first and second dopant material source layers 304, 306 (FIG. 3B) is shown. As illustrated, FIG. 3C shows a first laser beam 312 directed on a first portion 315 of the stack 300 to form the single dopant material source layer 310. The first laser beam 312 may be generated from the laser source 102 as shown in FIG. 1. A first laser profile of the first laser beam 312 may be tuned as the configuration 101 (FIG. 1) to mix dopants of both the P and N impurity conductivity types from the first and second dopant material source layers 304, 306 into the single dopant material source layer 310. It is to be understood that a laser profile, such as the first laser profile encompasses use of a particular laser tool, a laser beam of a particular characteristic or uses certain specific settings based on a laser process that may be deployed in an embodiment.

Consistent with one embodiment, the single dopant material source layer 310 is a boro phospho silicate glass (BPSG) layer. The Boron content of the BPSG may be less than the Phosphorus content. For example, the percent composition of Boron may range from 0.1% to 5% and the percent composition of Phosphorus may range from 5% to 8% in the BPSG layer. As a particular example, the BPSG layer may have (a) 5% boron and 5% phosphorus, (b) 3% boron and 5% phosphorus, or (c) 5% boron and 8% phosphorus. The percent composition of Boron and Phosphorus in the BPSG layer may vary depending on the process. It should be noted that the discussion of the formation of the BPSG layer is not intended to be limiting as to the scope of the invention described herein since a doping layer, e.g., the single dopant material source layer 310 could also be formed using other materials that also provide an amount of a dopant material to the surface of the substrate 302 during one or more thermal processing steps without deviating from the basic scope of the embodiment described herein.

One example of a laser for the first laser beam 312 is a diode-pumped solid state (DPSS) ultra-violet (UV) laser of 1064 nm wavelength which in one embodiment is changed to 532 nm using a frequency dubbler and/or changed to 355 nm using a tippler. The UV laser can be applied to the stack 300 so that the single dopant material source layer 310 forms as a (BPSG) layer. Other UV laser such as an excimer laser may be used.

Figure 3D:
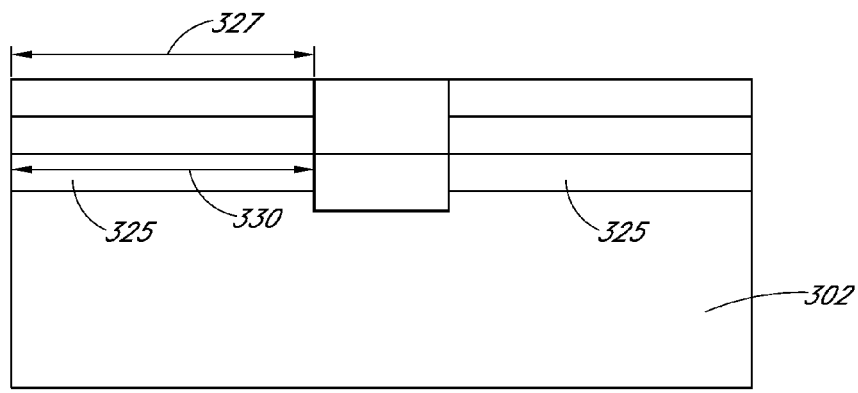

Further referring to operation 204 of the flowchart 200, and to corresponding FIG. 3C, by using the first laser beam 312 the substrate 302 may be patterned to form a first emitter 318 of the solar cell from the dopants of N-type type that are available in the single dopant material source layer 310. The first laser beam 312 diffuses the dopants of N-type into a first portion 320 of the substrate 302 underneath the single dopant material source layer 310 at a first dopant concentration level (1E18 atom/cm3-1E19 atom/cm3) based on the N-type dopants such as approximately 1-10% wt present in the second dopant material source layer 306. Although the first emitter 318 is illustrated as a narrow region, in some embodiments, the first emitter 318 can be formed as big as a P-type emitter. FIGS. 3C-3D illustrate a cross-sectional view of an exemplary N-type emitter.

One example of a laser for the first laser beam 312 is a UV laser to drive the N-type dopants from the single dopant material source layer 310, i.e., the (BPSG) layer into the substrate 302. The UV laser can be applied to the single dopant material source layer 310, i.e., the (BPSG) layer so that the first emitter 318 is formed. Alternatively a green laser may be used to heat the underlying substrate, which would enable dopant diffusion in the Si.

Referring to operation 206 of the flowchart 200, and to corresponding FIG. 3D, patterning of the substrate 302 is shown to form a second emitter 325 of the solar cell 360 from the dopants of P-type in the first dopant material source layer 304 of the stack 300 adjacent to the first emitter 318. The second emitter 325 being of P-type is different than the first emitter 318 being of N-type.

Referring to operation 208 of the flowchart 200, and to corresponding FIG. 3D, to form the second emitter 325, the dopants of P-type may be thermally driven from a second portion 327 of the stack 300 of the first and second dopant material source layers 304, 306 into a second portion 330 of the substrate 302 adjacent to the single dopant material source layer 310. For diffusing dopants, a thermal anneal or a high-temperature drive step can be performed, in one embodiment, to diffuse dopants from the first dopant material source layer 304 to form a P-type diffusion region in the substrate 302. The thermal anneal or high-temperature drive step may be performed for about a time in a range of 30-60 minutes (e.g., 30 minutes) at a temperature range between 600° C. and 1100° C. (e.g., 950° C.). The furnace temperatures can correspond to any selected from the range between 600° and 1100° C., such as a lower temperature of 700° C. and an upper temperature of 900° C. As can be seen from FIG. 3D, the second portion 330 of the stack 300 is different than the first portion 315 of the stack 300 and the second portion 330 of the substrate 302 is different than the first portion 320 of the substrate 302.

Consistent with one embodiment, a P-type dopant source that comprises Boron may be used to form a P-type diffusion region of the second emitter 325. Likewise, an N-type dopant source that comprises Phosphorus may be used to form an N-type diffusion region of the first emitter 318. A dopant source is a source of charge carrier impurity atoms for a substrate such Boron is for a silicon based substrate. For example, in one embodiment, the charge carrier impurity atoms are N-type dopants, such as but not limited to phosphorus dopants. In another embodiment, the charge carrier impurity atoms are P-type dopants, such as but not limited to boron dopants. In a back-contact solar cell, such as the solar cell 360, with interdigitated N-type and P-type diffusions in the substrate 302 there is a PN junction that may be formed within the substrate 302 at an interface between the two diffusions.

In one embodiment, the P-type diffusion region and N-type diffusion region are active regions. Conductive contacts may be coupled to the active regions and separated from one another by isolation regions, which may be composed of a dielectric material. In an embodiment, the backside contact solar cell 360 further includes an anti-reflective coating layer (e.g., dielectric) disposed on a light-receiving surface, such as on a random textured surface of the solar cell.

The solar cell 360 may further include conductive contacts formed on emitter regions which are formed in the substrate 302, in accordance with an embodiment. A first electrically conductive contact such as a first metal contact finger may be disposed in a first contact opening and may be coupled to the N-type diffusion region. A second electrically conductive contact such as a second metal contact finger may be disposed in a second contact opening and may be coupled to the P-type diffusion region. In an embodiment, a first metal contact finger and a second metal contact finger are back contacts for the back-contact solar cell 360 and are situated on a surface of the solar cell 360 opposing a light receiving surface of the solar cell 360. The "fingers" may be made using masks and etch or according to other techniques.

Figure 3E:
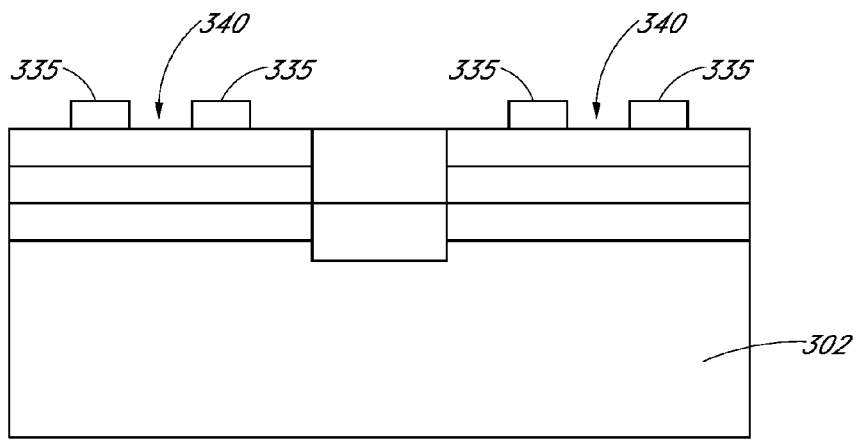
Figure 3F:
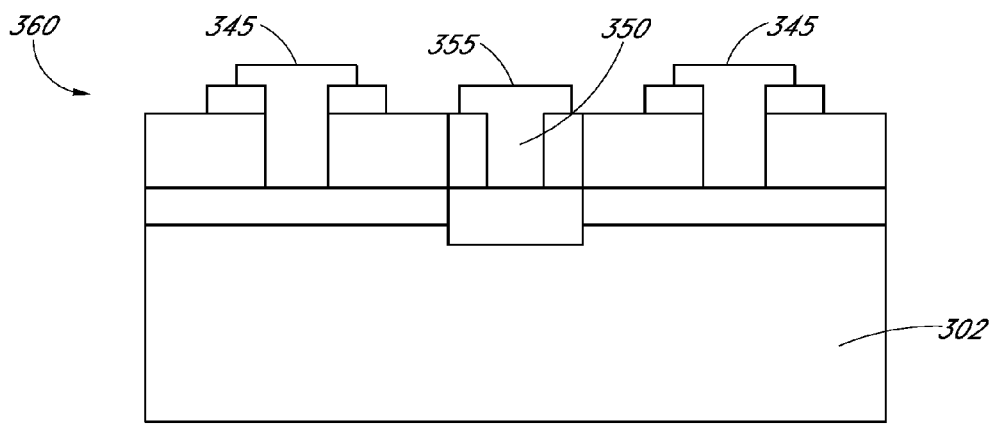

Referring to operation 210 of the flowchart 200, and to corresponding FIGS. 3E-3F, metal contacts may be formed to the first and second emitters 318, 325, respectively. In FIG. 3E, according to one embodiment, optionally insulator layers 335 may be formed over portions of the stack 300 that lie over the P-type diffusion regions of the second emitters 325. The insulator layers 335 are formed by screen-printing in one embodiment. Alternatively, these can be formed by ink-jet printing or other low-cost printing technique. Accordingly, insulator layers 335 may comprise polyimide or other dielectric that may be formed by screen-printing or ink-jet printing. First contact holes 340 are defined in the insulator layers 335 to allow subsequently formed first metal contacts 345 (See FIG. 3F) to electrically contact the P-type diffusion regions of the second emitters 325.

In FIG. 3F, portions of the stack 300 under the first contact holes 340 are etched away. Likewise, portions of the stack are etched away to form second contact holes 350. The first metal contacts 345 are formed over the insulator layers 335 and through the first contact holes 340 to create electrical connections between the first metal contacts 345 and the P-type diffusion regions of the second emitters 325. Second metal contacts 355 are formed over the stack 300 and through the second contact holes 350 to create electrical connections between the second metal contacts 355 and the N-type diffusion region of the first emitter 318. The first contact holes 340 and the second contact holes 350 do not have to be made by a laser but could be made with a wet etch process and in one embodiment go all the way to the first and second emitters 318, 325, respectively, and do not stop in any of the oxide layers.

The backside contact solar cell 360 as shown in FIG. 3F, and the other solar cells disclosed herein, may also be fabricated using the fabrication steps disclosed above. Other fabrication techniques for fabricating the solar cell structures of the backside contact solar cell 360 may also be used without detracting from the merits of the present disclosure.

Each embodiment of a backside contact solar cell can have a different form. One example embodiment is illustrated in FIG. 3F with adjacent first and second emitters 318, 325. As used herein, diffusion regions and emitters are used interchangeably to refer to doped regions of the substrate 302 of a solar cell. In certain embodiments, including the illustrated embodiment, the backside contact solar cell 360 includes the first emitter 318 surrounded by two second emitters 325. In other embodiments, however, more or fewer emitters can be included in a solar cell, resulting in variations in the size and shape. Thus, other embodiments of emitters can be used in the solar cells described herein. For example, the number and location of the emitters can vary between embodiments. The first and second emitters 318, 325 are illustrated as having a rectangular shape, although any other desired shape or size can be used, such as circular, irregular, and so on. In certain embodiments, including the illustrated embodiment, the dopant concentration levels are similar in the first and second emitters 318, 325, while in other embodiments, they may be different from one another, depending upon a particular embodiment of the solar cell.

Use of laser doing, in one embodiment, provides more precise alignment, e.g., 10 microns vs. 100 microns available from other patterning processes. And another advantage is that an entire panel of solar cells can be laser treated at once as compared to one solar cell being fabricated by standard patterning techniques.

The first and second dopant material source layers 304, 306 thicknesses may vary depending on the laser and thermal processes, to give an optimal dopant selection. For example, the first dopant material source layer 304, e.g., the BSG film may be thick enough so that the Phosphorous does not drive through the BSG film during the thermal drive step. The amount of Boron in the BSG film and the amount of Phosphorous in the second dopant material source layer 306, e.g., the PSG film may be selected to achieve a desired doping of the second emitter 325, e.g., the P-type emitter and the first emitter 318, e.g., the N-type emitter, respectively. While the Boron doping may be controlled by the Boron concentration in the BSG film, the BSG film thickness and the thermal anneal step, the Phosphorous doping may be controlled by the Phosphorous concentration in the PSG film, the laser process, the Boron concentration in the BSG film (due to the BPSG formation), and the thermal anneal step. The thermal process may be be optimized for both of the dopant diffusions and the anneal removal of laser damage to the emitter, as well as combined into a front solar cell surface passivation step if desired.

Overall, the process flow of the flowchart 200 as shown in FIG. 2 may result in simplification of a solar cell fabrication process by patterning the BSG and PSG layers independently, removing a mask step and an etch step or combining the BSG and PSG depositions into a single step/tool. The process flow of the flowchart 200 may also allow for better design rules, which may decrease the pitch of the solar cell and thereby increase cell efficiency while decreasing cost.

Figure 4:
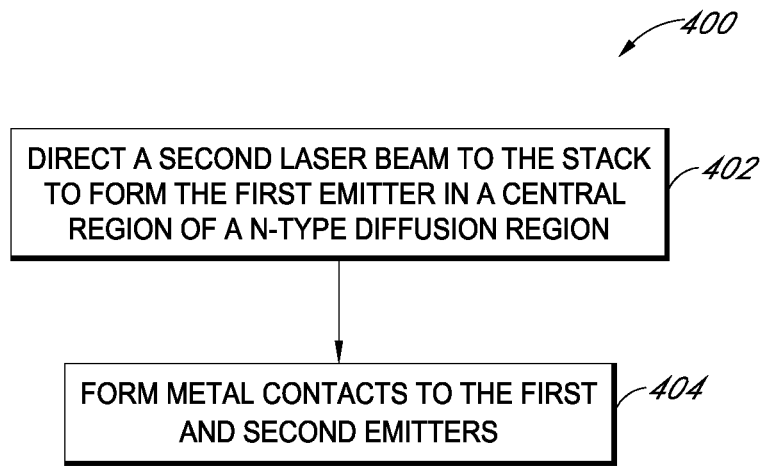
FIG. 4 is a schematic representation of an embodiment of a method, technique, and process for forming an emitter of a backside contact solar cell with lasers, according to one embodiment.

Referring to FIG. 4, a flowchart 400 is shown that represents operations in a method of forming a selective N-type emitter for a backside contact solar cell, in accordance with an embodiment. As such, in one embodiment, the selective N-type emitter enables a relatively better passivation with a lower level of doping outside of the metal contact region, and better contact resistance with higher doping within the contact region.

Figure 5:
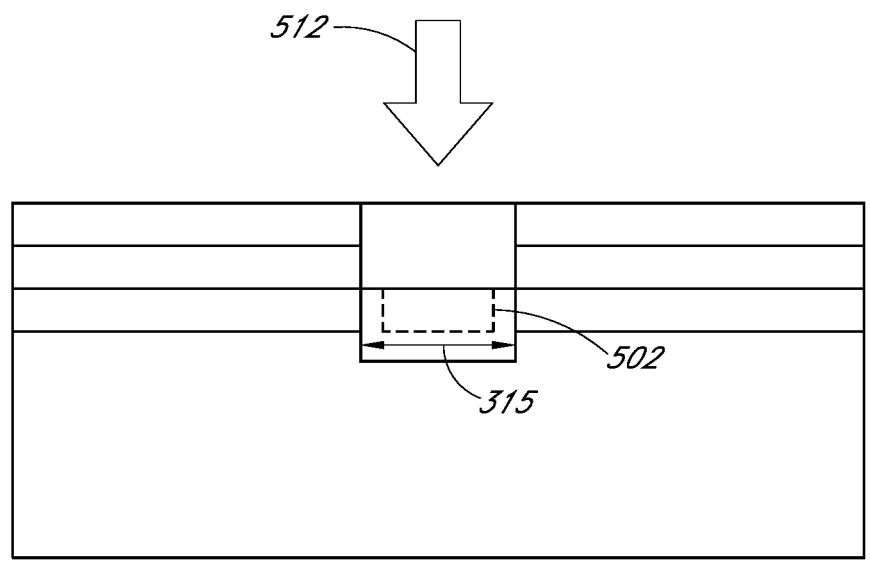
FIG. 5 illustrates a cross-sectional view of an emitter of a backside contact solar cell with lasers, according to some embodiments.

FIG. 5 illustrates a cross-sectional view of a stage in the fabrication of a backside contact solar cell, corresponding to operations of flowchart 400, in accordance with an embodiment of the present invention.

The embodiments shown in FIGS. 4 and 5 can include all or some of the method steps shown in FIGS. 2 and 3A-3F. However, in order to form a selective N-type emitter, an additional process step can be introduced either after step 206 or step 208. As illustrated, an additional step is being introduced after the method step of 208 of FIG. 2 having the corresponding cross-sectional view FIG. 3D. This additional step is described next as the first method step in FIG. 4.

Referring to operation 402 of the flowchart 400, and to corresponding FIG. 5, a method of forming a trenchless N-type emitter, i.e., a first emitter for a backside contact solar cell includes directing a second laser beam 512 on a region 502 of the first portion 315 of the stack 300 to diffuse the dopants of N-type impurity conductivity type at a second dopant concentration level by using the second laser beam 512. As illustrated, the second dopant concentration level is higher than the first dopant concentration level of the N-type dopants in the remaining first portion 315 of the stack 300 (see FIG. 5). As illustrated, FIG. 5 shows a selective emitter embodiment of the first emitter 318. One potential benefit of forming the emitters using such an approach is the possibility of forming a sharp diffusion boundary in the Si, between the positive and negative regions, which would allow a lower trench recombination. Typical thermal diffusions result in a large boundary layer between positive and negative regions, which results in significant recombination and lower efficiency. High-efficiency solar cell design often requires the formation of a trench to remove this area and prevent recombination, however, these extra steps add cost and complexity. Use of lasers to form sharp junctions opens the space of high-efficiency, cost-effective process.

Referring to operation 404 of the flowchart 400, metal contacts may be formed to the first and second emitters 318, 325, respectively in the same manner as shown in FIGS. 3E-3F.

Figure 6:
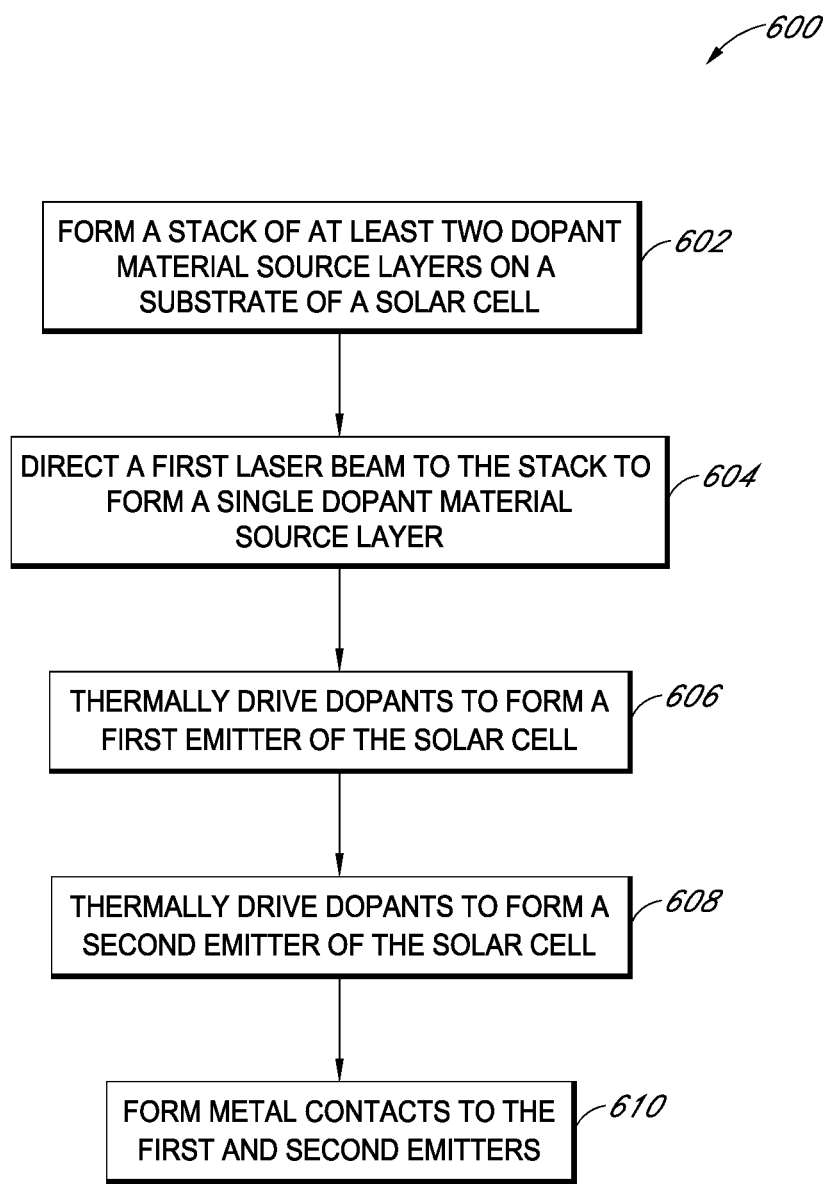
FIG. 6 is a flow chart of an embodiment of a method, technique, and process for forming emitters of a backside contact solar cell thermally, according to one embodiment.

Another embodiment of forming the first and second emitters 318, 325 is shown in FIG. 6. For the ease of understanding of this embodiment relative to the embodiment shown in FIG. 2, the steps 204 and 206 of FIG. 2 are referred to again next in the context of FIG. 6. The specific embodiment shown in FIG. 6 can include all the method steps shown in FIGS. 2 and 3A-3F except that the laser step 204 is altered and a new method step replaces the method step 206.

During the laser step 204 in FIG. 2, there may be near complete diffusion of an N-type emitter, i.e., the first emitter 318. An alternative process is described next where there is nearly no diffusion of the N-type emitter during the laser step, as shown next in the FIG. 7A. This alternate process depends upon a laser profile including a laser selection, laser process variables, and the film thicknesses for the BSG and PSG films.

Figure 7A:
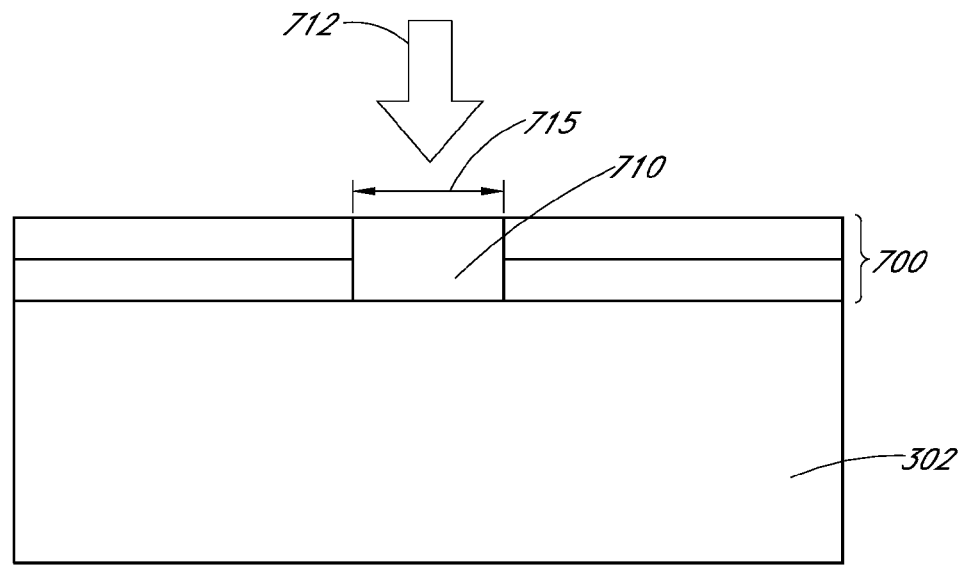
FIGS. 7A-7B illustrate cross-sectional views of forming emitters of a backside contact solar cell thermally, according to some embodiments.
Figure 7B:
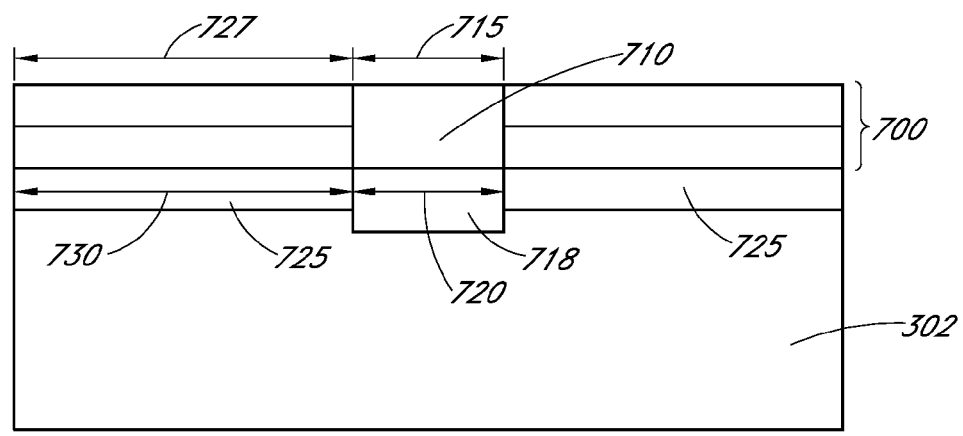

Referring to FIG. 6, a flowchart 600 is shown that represents operations in a method of forming P-type and N-type emitters for a backside contact solar cell, in accordance with another embodiment. FIGS. 7A-7B illustrate cross-sectional views of various stages in the fabrication of a backside contact solar cell, corresponding to operations of flowchart 600, in accordance with an embodiment of the present invention. In this example, the mentioned process steps are performed in the order shown. In other examples, the process steps can be performed in other orders. It is to be noted that other process steps not necessary for understanding are omitted in the interest of clarity.

Referring to operation 602 of the flowchart 600, and to corresponding FIG. 7A, a method of forming a stack 700 (similar to FIG. 3B) of the first dopant material source layer 304 having P-type dopants and the second dopant material source layer 306 having N-type dopants above the solar cell substrate 302 (see FIG. 3A) of the solar cell is shown. Referring to operation 604 of the flowchart 600, and to corresponding FIG. 7A, forming of a first single dopant material source layer 710 containing both P-type dopants and N-type dopants sourced from both the first and second dopant material source layers 304, 306 (FIG. 3B) is shown. As illustrated in FIG. 7A, a third laser beam 712 may be directed to a third portion 715 of the stack 700 to form the first single dopant material source layer 710.

Referring to operation 606 of the flowchart 600, and to corresponding FIG. 7B, to form a third emitter 718, the dopants of N-type may be thermally driven from the third portion 715 of the stack 700 of the first and second dopant material source layers 304, 306 into a third portion 720 of the substrate 302 underneath the first single dopant material source layer 710.

Referring to operation 608 of the flowchart 600, and to corresponding FIG. 3D, to form a fourth emitter 725, the dopants of P-type may be thermally driven from a fourth portion 727 of the stack 700 of the first and second dopant material source layers 304, 306 into a fourth portion 730 of the substrate 302 adjacent to the first single dopant material source layer 710. Referring to operation 610 of the flowchart 600, metal contacts may be formed to the third and fourth emitters 718, 725, respectively in the same manner as shown in FIGS. 3E-3F.

Figure 8:
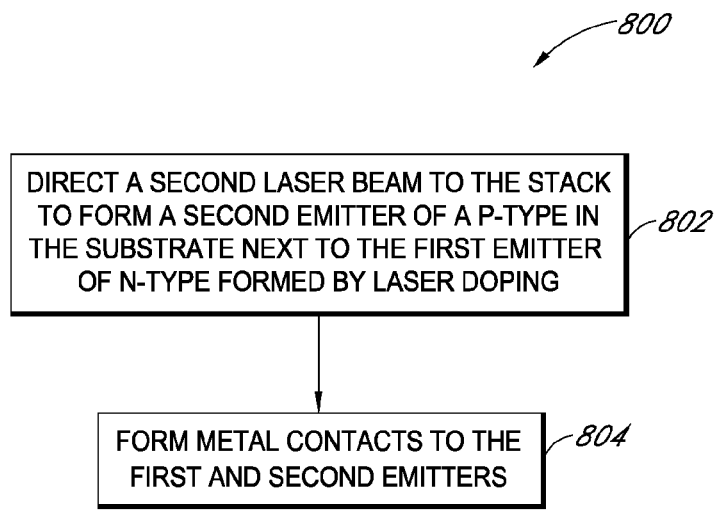
FIG. 8 is a flow chart of another embodiment of a method, technique, and process for forming both emitters of a backside contact solar cell by laser doping, according to one embodiment.

Another embodiment of forming the first and second emitters 318, 325 is shown in FIG. 8. For the ease of understanding of this embodiment relative to the embodiment shown in FIG. 2, the step 208 of FIG. 2 is discussed next. The specific embodiment shown in FIG. 8 can include some or all of the method steps shown in FIGS. 2 and 3A-3F except that the thermal step 208 is replaced with a new method step as a laser step.

Figure 9:
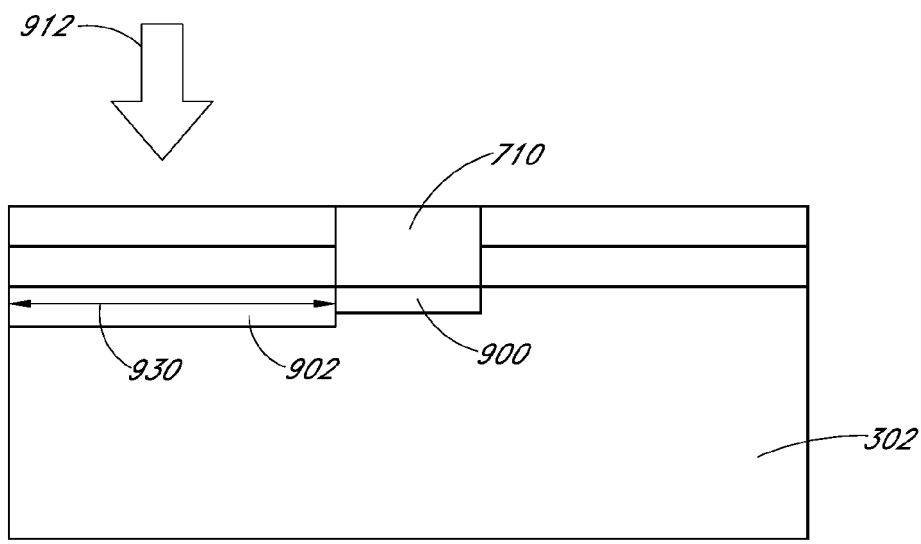
FIG. 9 illustrates a cross-sectional view of emitters of a backside contact solar cell, according to some embodiments.

Referring to FIG. 8, a flowchart 800 is shown that represents operations in a method of forming both P-type and N-type emitters for a backside contact solar cell by laser doping, in accordance with one embodiment. FIG. 9 illustrates a cross-sectional view of a stage in the fabrication of a backside contact solar cell, corresponding to operations of flowchart 800, in accordance with an embodiment of the present invention.

Referring to operation 802 of the flowchart 800, and to corresponding FIG. 9, a method of forming a P-type emitter 902, e.g., the second emitter 325 after forming a N-type emitter 900, e.g., the first emitter 318 by laser doping (see operation 204 and corresponding FIG. 3C) for a backside contact solar cell is shown. It includes directing a fourth laser beam 912 on a fifth portion 930 of the substrate 302 adjacent to the first single dopant material source layer 710 to diffuse the dopants of P-type impurity conductivity type by using the fourth laser beam 912. As illustrated, a desired dopant concentration level of the P-type dopants in the fifth portion 930 of the substrate 302 may be obtained by controlling the configuration of the laser beam or dopant level in the first dopant material source layer 304 having P-type dopants (see FIG. 5).

As illustrated, FIG. 9 shows a laser doping embodiment of the N-type and P-type emitters 900, 902. Referring to operation 804 of the flowchart 800, metal contacts may be formed to the N-type and P-type emitters 900, 902, respectively in the same manner as shown in FIGS. 3E-3F.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A solar cell, comprising:
   a solar cell substrate;
   a homogenous stack of at least two dopant source material layers disposed over a first portion of the solar cell substrate, wherein a dopant material source layer of the at least two dopant material source layers has dopants of an impurity conductivity type of opposite polarity from dopants of an impurity conductivity type of an adjacent dopant material source layer of the at least two dopant material source layers;
   a heterogeneous dopant source material layer formed in a second portion of the solar cell substrate, the heterogeneous dopant source material layer including a mixture of the dopants of both the different impurity conductivity types from the at least two dopant source material layers, the second portion of the solar cell substrate different than the first portion of the solar cell substrate; and a first emitter having dopants of one impurity conductivity type of the different impurity conductivity types, the first emitter disposed under the heterogeneous dopant source material layer.

2. The solar cell of claim 1, further comprising:
a second emitter having dopants of another impurity conductivity type of the different impurity conductivity types, the second emitter disposed under the stack of at least two dopant source material layers, wherein the another impurity conductivity type is opposite to the one impurity conductivity type.

3. The solar cell of claim 1, wherein a central region of the first emitter is doped with a greater dopant concentration level than a non-central region of the first emitter.

4. The solar cell of claim 1, further comprising:
a first metal contact electrically connected to the first emitter; and
a second metal contact electrically connected to the second emitter.

5. The solar cell of claim 4, wherein the first metal contact is formed in a first hole in an insulator layer above the first and second emitters, and wherein the second metal contact is formed in a second hole in the insulator layer.

6. The solar cell of claim 1, wherein one of the dopant material source layer or the adjacent dopant material source layer is a boron silicate glass (BSG) layer, and wherein the other of the dopant material source layer or the adjacent dopant material source layer is a phosphorus silicate glass (PSG) layer.

7. A solar cell, comprising:
a solar cell substrate;
a stack of dopant source material layers disposed over a first portion of the solar cell substrate, wherein a first dopant material source layer of the stack of dopant source material layers has N-type dopants, and a second dopant material source layer of the of the stack of dopant source material layers has P-type dopants and is adjacent to the first dopant material source layer;
a heterogeneous dopant source material layer formed over a second portion of the solar cell substrate, the heterogeneous dopant source material layer including a mixture of the N-type dopants and the P-type dopants, wherein the second portion of the solar cell substrate is different than the first portion of the solar cell substrate; and
a first emitter having the N-type dopants, the first emitter disposed under the heterogeneous dopant source material layer.

8. The solar cell of claim 7, further comprising:
a second emitter having the P-type dopants, the second emitter disposed under the stack of dopant source material layers.

9. The solar cell of claim 7, wherein a central region of the first emitter is doped with a greater dopant concentration level than a non-central region of the first emitter.

10. The solar cell of claim 7, further comprising:
a first metal contact electrically connected to the first emitter; and
a second metal contact electrically connected to the second emitter.

11. The solar cell of claim 10, wherein the first metal contact is formed in a first hole in an insulator layer above the first and second emitters, and wherein the second metal contact is formed in a second hole in the insulator layer.

12. The solar cell of claim 7, wherein the first dopant material source layer of the stack of dopant source material layers is a phosphorus silicate glass (PSG) layer.

13. The solar cell of claim 7, wherein the second dopant material source layer of the stack of dopant source material layers is a boron silicate glass (BSG) layer.

14. A solar cell, comprising:
a solar cell substrate;
a stack of dopant source material layers disposed over a first portion of the solar cell substrate, wherein a first dopant material source layer of the stack of dopant source material layers has P-type dopants, and a second dopant material source layer of the of the stack of dopant source material layers has N-type dopants and is adjacent to the first dopant material source layer;
a heterogeneous dopant source material layer formed over a second portion of the solar cell substrate, the heterogeneous dopant source material layer including a mixture of the N-type dopants and the P-type dopants, wherein the second portion of the solar cell substrate is different than the first portion of the solar cell substrate; and
a first emitter having the P-type dopants, the first emitter disposed under the heterogeneous dopant source material layer.

15. The solar cell of claim 14, further comprising:
a second emitter having the N-type dopants, the second emitter disposed under the stack of dopant source material layers.

16. The solar cell of claim 14, wherein a central region of the first emitter is doped with a greater dopant concentration level than a non-central region of the first emitter.

17. The solar cell of claim 14, further comprising:
a first metal contact electrically connected to the first emitter; and
a second metal contact electrically connected to the second emitter.

18. The solar cell of claim 17, wherein the first metal contact is formed in a first hole in an insulator layer above the first and second emitters, and wherein the second metal contact is formed in a second hole in the insulator layer.

19. The solar cell of claim 14, wherein the first dopant material source layer of the stack of dopant source material layers is a boron silicate glass (BSG) layer.

20. The solar cell of claim 14, wherein the second dopant material source layer of the stack of dopant source material layers is a phosphorus silicate glass (PSG) layer.

* * * * *